(12) United States Patent
Bae et al.

(10) Patent No.: US 6,784,106 B2
(45) Date of Patent: Aug. 31, 2004

(54) WAFER DRYING METHOD

(75) Inventors: Jeong-Yong Bae, ChungCheongNam-do (KR); Chang-Ro Yoon, ChungCheongNam-do (KR); Pyeng-Jae Park, ChungCheongNam-do (KR)

(73) Assignee: DNS Korea Co., Ltd, Chungcheongnam-do (KR)

( * ) Notice: Subject to any disclaimer, the term of this patent is extended or adjusted under 35 U.S.C. 154(b) by 154 days.

(21) Appl. No.: 10/183,788

(22) Filed: Jun. 26, 2002

(65) Prior Publication Data
US 2003/0124878 A1 Jul. 3, 2003

(30) Foreign Application Priority Data
Dec. 28, 2001 (KR) .......................................... 2001-87125

(51) Int. Cl.[7] .......................................... H01L 21/302
(52) U.S. Cl. .......................................... 438/689; 34/282
(58) Field of Search .......................... 438/689; 34/282

(56) References Cited

U.S. PATENT DOCUMENTS

| | | | | |
|---|---|---|---|---|
| 4,801,352 A | * | 1/1989 | Piwczyk | 156/345.5 |
| 5,565,034 A | * | 10/1996 | Nanbu et al. | 118/668 |
| 5,725,664 A | * | 3/1998 | Nanbu et al. | 118/52 |
| 5,931,721 A | * | 8/1999 | Rose et al. | 451/89 |
| 6,116,235 A | * | 9/2000 | Walters et al. | 128/200.24 |
| 6,446,355 B1 | * | 9/2002 | Jones et al. | 34/245 |
| 2002/0029791 A1 | * | 3/2002 | Matsuoka | 134/18 |

* cited by examiner

*Primary Examiner*—John Niebling
*Assistant Examiner*—Olivia T. Luk
(74) *Attorney, Agent, or Firm*—Marger Johnson & McCollom, P. C.

(57) ABSTRACT

A method for drying a semiconductor substrate includes the steps of clearing the substrate by supplying a liquid into a processing bath of a chamber, injecting first dry gases onto a surface of the supplied liquid, draining the liquid from the processing bath so that the substrate is slowly exposed to the surface of the liquid, and injecting a second dry gas into the chamber and forcibly exhausting gas in the chamber.

16 Claims, 7 Drawing Sheets

WAFER DRYING METHOD

RELATED APPLICATION

This application relies for priority upon Korean Patent Application No. 2001-87125, filed on Dec. 28, 2001, the contents of which are herein incorporated by reference in their entirety.

FIELD OF THE INVENTION

The present invention relates to a method for fabricating a semiconductor device used in a wafer cleaning process and, more particularly, to a method for drying a wafer subjected to a cleaning process.

BACKGROUND OF THE INVENTION

As semiconductor devices are continuously scaled down, the wafer cleaning techniques have been diversified and increasingly significant. Particularly in a process for fabricating semiconductor devices having a fine structure, particles attached to a cleaned wafer, static electricity, watermarks, and linear particles have a great effect on subsequent processes. Therefore, what is needed is a wafer drying process.

There were suggested a spin dryer and an IPA vapor dryer. In drying a wafer, the spin dryer uses a centrifugal force while the IPA vapor dryer uses a low vapor pressure of isopropyle alcohol (IPA). However, the dryers cannot completely remove watermarks that occur on a wafer surface or between patterns. In order to avoid this problem, a Marangoni dryer has been widely used. The Marangoni dryer uses a difference between surface tenses of the IPA and water.

A drying process using the Marangoni effect will now be described in brief hereinbelow.

After wafers are rinsed out by de-ionized water (hereinafter referred to as "DIW"), the IPA vapor is fed to an upper interior space of a rinsing bath and the DIW is slowly withdrawn. Thus, the water is eliminated from a wafer surface. When the DIW is completely drained, the nitrogen of high temperature is fed thereinto to evaporate the DIW remaining on the wafer surface. Unfortunately, the evaporated DIW and residues including particles are not fully issued out. They cause the irregular liquid flow (turbulence) in the rinsing bath together with the nitrogen, so that the wafer surface is not uniformly dried and the water remains at a portion contacting with a wafer guide. In addition, since the Marangoni dryer cannot fundamentally prevent oxygen from reacting on the wafer, it cannot suppress formation of an oxide layer.

SUMMARY OF THE INVENTION

A feature of the present invention to provide a wafer drying method that fundamentally prevents oxygen from reacting on a wafer surface during a wafer drying process to suppress formation of an oxide layer.

Another feature of the present invention is to provide a wafer drying apparatus that improves a wafer drying efficiency.

To achieve these features, the present invention provides a method for drying a semiconductor substrate. The method comprises the steps of clearing the substrate by supplying a liquid into a processing bath of a chamber, decompressing an inside of the chamber, draining the liquid from the processing bath and injecting a first dry gas onto a surface of the liquid in the processing bath, and injecting a second dry gas onto the substrate after the liquid is completely drained therefrom. The second dry gas is nitrogen or carbon dioxide or dry air. A temperature of the second dry gas is between an ordinary temperature and 120° C.

The inside of the chamber is decompressed by exhausting air from the chamber through a vacuum exhaust pipe installed at the cover. In the step of injecting the second dry gas, the second dry gas is vacuum-drained.

According to another aspect of the invention, a method of drying a semiconductor substrate comprises the steps of clearing the substrate by supplying a liquid into a processing bath of a chamber, injecting first dry gases onto a surface of the liquid supplied into the processing bath, draining the liquid from the processing bath so that the substrate is slowly exposed to the surface of the liquid, and injecting a second dry gas into the chamber and forcibly exhausting the gas in the chamber. The method further comprises a step of decompressing the inside of the chamber before injecting the first dry gas to exhaust air in the chamber. The air in the chamber is exhausted through an exhaust port installed at the cover. The step of exhausting the air in the chamber includes a step of supplying an inert gas into the chamber.

When the liquid is completely drained from the processing bath, the second dry gas is vertically injected from an upper part of the processing bath, and the second dry gas injected into the processing bath and vapor evaporated from a wafer surface by the second dry gas are forcibly exhausted to an exterior of the processing bath. The gas in the processing bath is exhausted through an exhaust pipe connected to a drain pipe where the liquid is drained. The second dry gas is injected after completely draining the liquid in the processing path. The second dry gas is an inert gas preheated at a temperature between an ordinary temperature and 120° C., and the liquid is de-ionized water (DIW). The first dry gases are preheated alcohol vapor and nitrogen. The alcohol is one selected from the group consisting of methane alcohol, ethane alcohol, and isopropyle alcohol (IPA).

DESCRIPTION OF THE PREFERRED EMBODIMENT

The preferred embodiment of the present invention and its advantages are best understood by referring to attached drawings, like numerals being used for like and corresponding parts of the various drawings.

Figure 1:
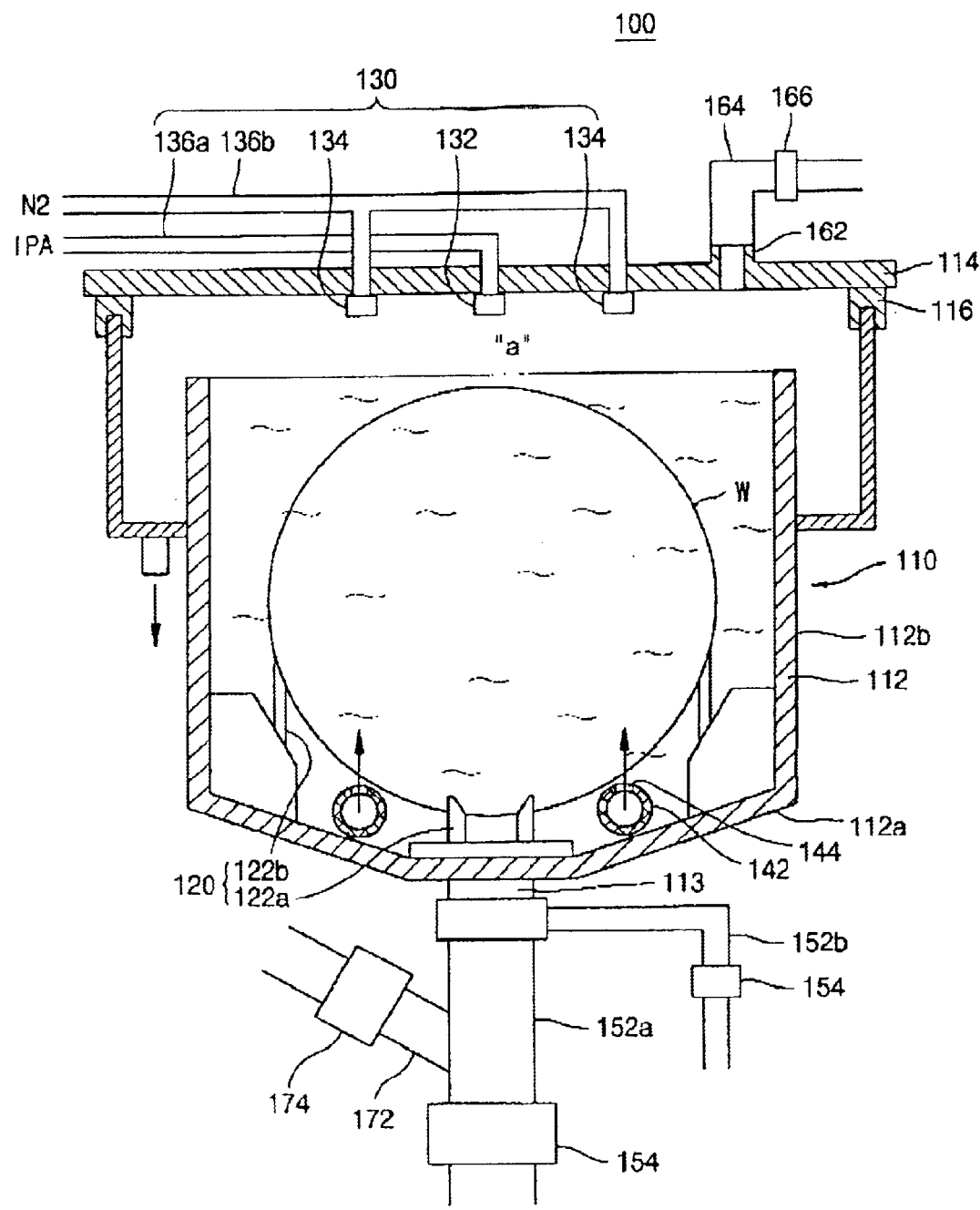
FIG. 1 is a cross-sectional view of an apparatus for realizing a wafer drying method according to a preferred embodiment of the present invention.

Referring now to FIG. 1, a wafer drying apparatus 100 made according to the invention includes a chamber 110, a gas distributor 130, a liquid flow system, and decompression means.

The chamber 110 has a processing bath 112 and a cover 114. The processing bath 112 includes a bottom 112a, sidewalls 112b, and an exhaust port 113. The processing bath 112 provides a space that is surrounded by the bottom 112a and the sidewalls 112b. The exhaust port 113 is extended from the bottom 112a of the processing bath 112. In an upper part of the processing bath 112, there is an opening that is opened and closed by the cover 114. An O-ring 116 is installed to seal between the cover 114 and the processing bath 112.

Wafers W in the processing are supported by a wafer guide 120. The wafer guide 120 may be comprised of at least three bars 122a and 122b that are perpendicularly disposed to the wafers W. For example, the wafer guide 120 is comprised of one central bar 122a and two side bars 122b disposed at both sides of the central bar 122a. The wafer guide 120 may be connected to a lift (not shown) for lifting up/down the wafers W.

The gas distributor 130 is installed at the cover 114 and includes an IPA nozzle 132 and N2 nozzles 134. Supply pipes 136a and 136b are connected to the IPA nozzle 132 and the N2 nozzles 134, respectively. Undoubtedly, the supply pipes 136a and 136b are connected to an IPA supply source (not shown) and an N2 supply source (not shown), respectively. The IPA and N2 used to dry a wafer are uniformly fed to the space of the processing bath 112 through the IPA nozzle 132 and the N2 nozzle 134.

The gas distributor 130 supplies IPA and an inert gas such as high-temperature or heated nitrogen into the processing bath 112 from an upper part of the processing bath 112.

The liquid flow system has supply means for continuously supplying a liquid into the processing bath 112 and drain means for continuously draining the liquid from the processing bath 112. The level and drain of the liquid are controlled by the supply means and the drain means. The supply means includes a distribution pipe 142 that is installed along the wafer guide 120 and has a number of injection holes 144. The distribution pipe 142 receives a liquid from an external liquid supply source through a liquid supply pipe. The drain means includes first and second drain pipes 152a and 152b and a control valve 154. The first and second drain pipes 152a and 152b are connected to the exhaust port 113 of the processing bath 112. The control valve is installed at the respective drain pipes 152a and 152b. For example, a diameter of the second drain pipe 152b is preferably smaller than that of the first drain pipe 152a so as to drain a solution slower than the first drain pipe 152a. The level of the liquid used in a cleaning process is controlled by the control valve 154.

The decompression means includes an exhaust port 162, a vacuum exhaust pipe 164 connected to the exhaust port 162, and an on/off valve for shutting on/off the vacuum exhaust pipe 164. Before supplying the IPA, the decompression means decompresses the chamber 110 so as to exhaust air (practically, oxygen) therein. After rinsing the wafer W, the air staying in a space "a" between the processing bath 112 and the cover 114 is exhausted through the exhaust port 162 to prevent the wafer W from reacting on the oxygen in the air. Therefore, it is possible to suppress formation of watermarks caused by the oxidation of a wafer surface.

The wafer drying apparatus 100 further includes means for forcibly exhausting the IPA and N2 supplied into the chamber 110. The forcibly exhausting means has a first exhaust pipe 172 connected to the first drain pipe 152a and an on/off valve 174 for shutting on/off the exhaust pipe 174. The on/off value 174 is closed when the solution in the processing bath 112 is drained, and is opened after the solution is completely drained or when the N2 is supplied. More specifically, after the solution is completely drained, the N2 is injected from the N2 nozzle 134 installed at the cover 114. When vacuum exhaustion is conducted through the drain port 113, an up-to-down flow is created in the processing bath 112. The up-to-down flow allows vapor, residues containing particles, and N2 to be exhausted quickly and surely to the first exhaust pipe 172 through the drain port 113.

Figure 2:
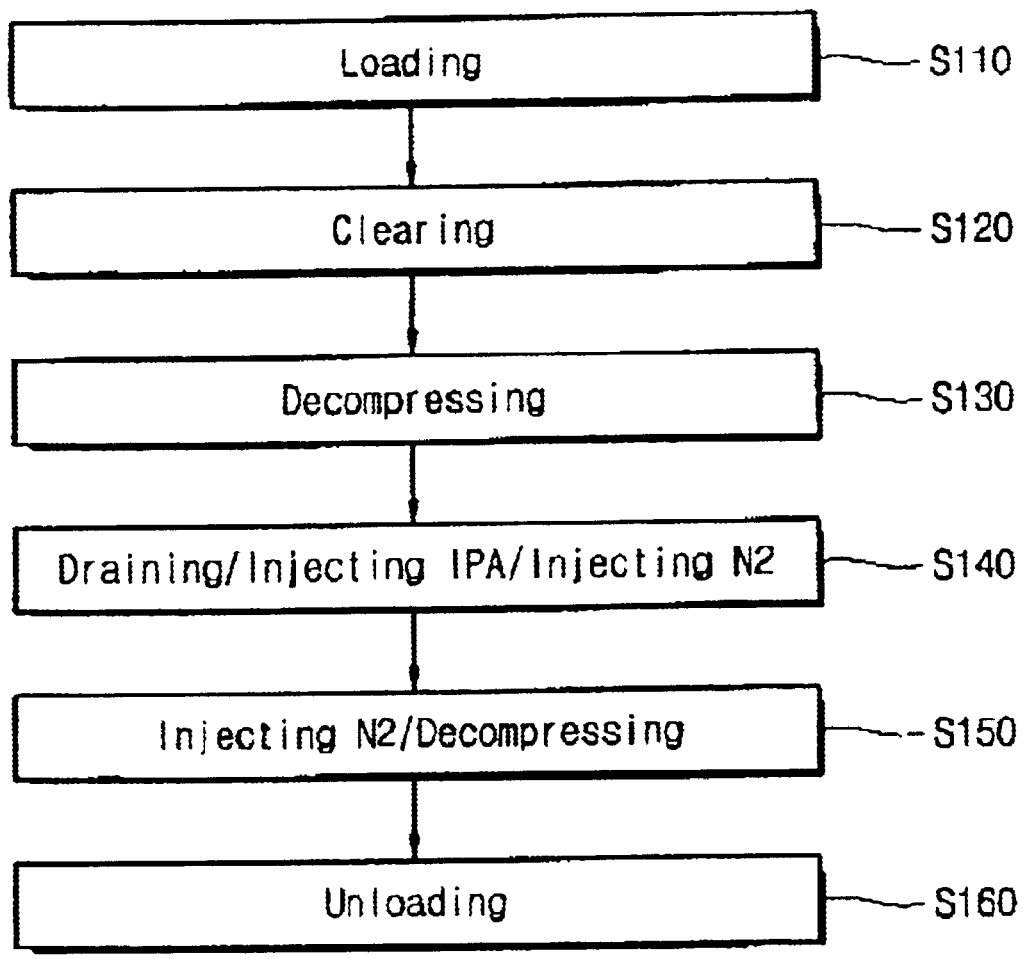
FIG. 2 is a flowchart of the wafer drying method according to the preferred embodiment of the present invention.
Figure 3:
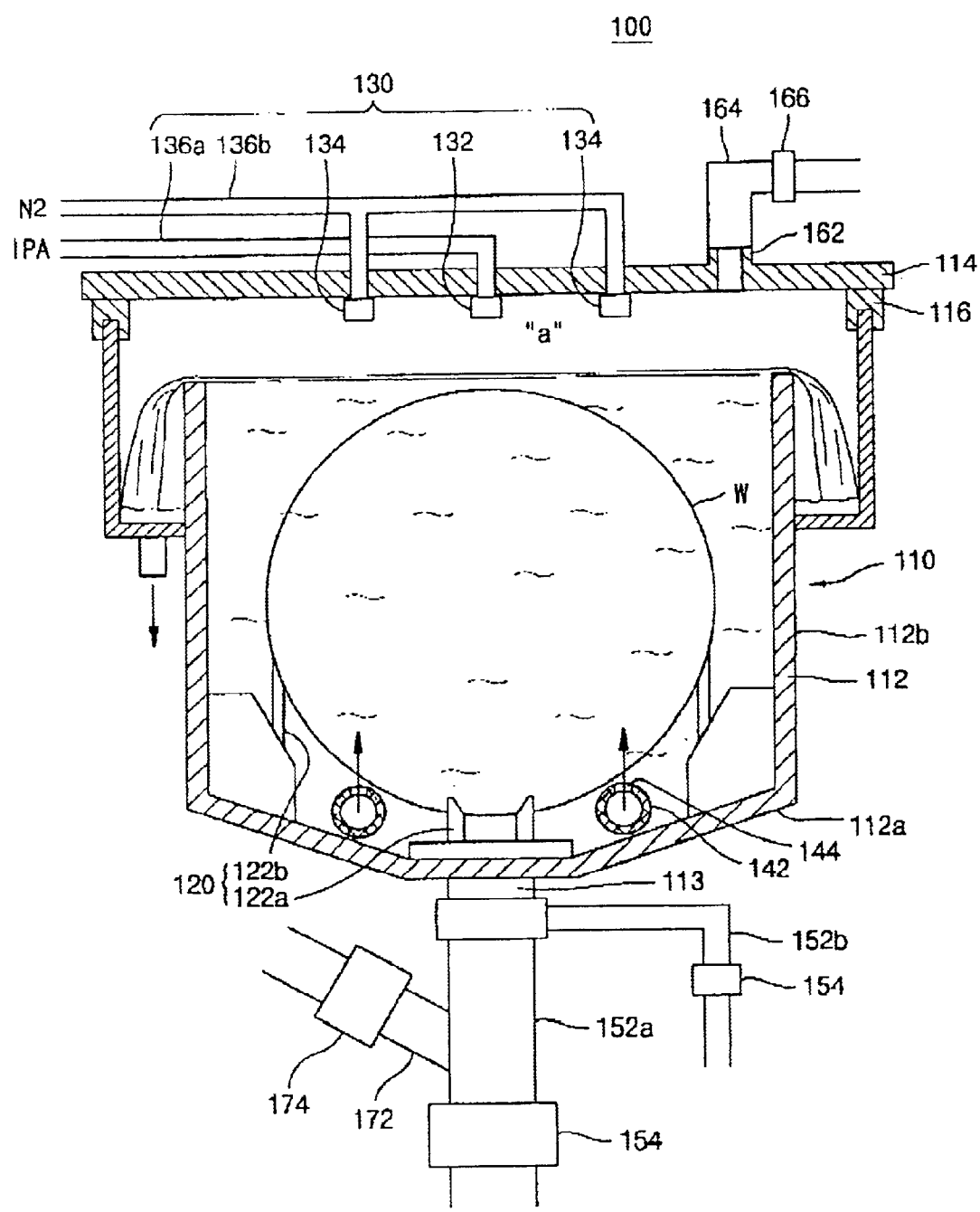
FIG. 3 through FIG. 7 are cross-section views for explaining a procedure of the wafer drying method according to the present invention.
Figure 4:
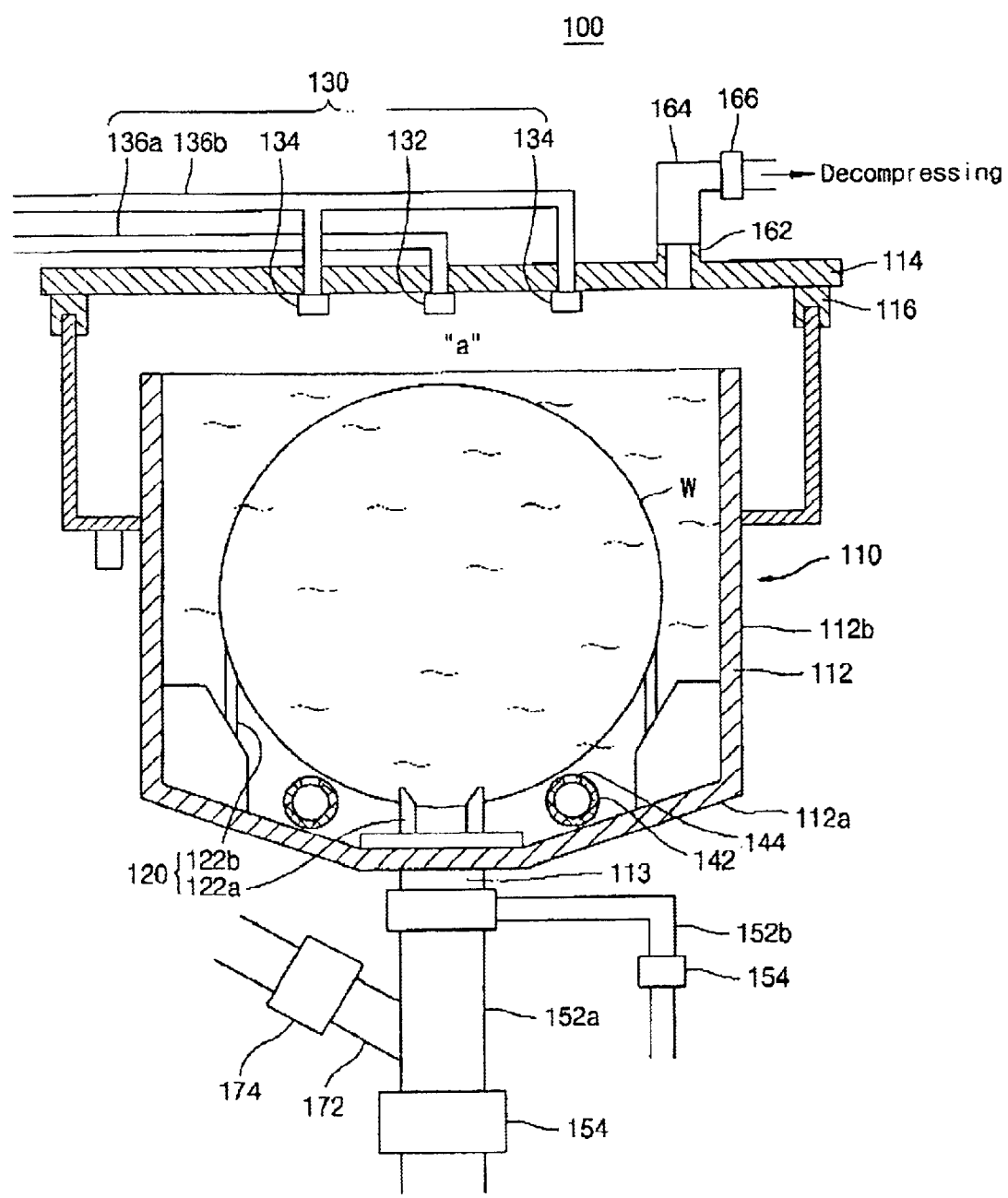
Figure 5:
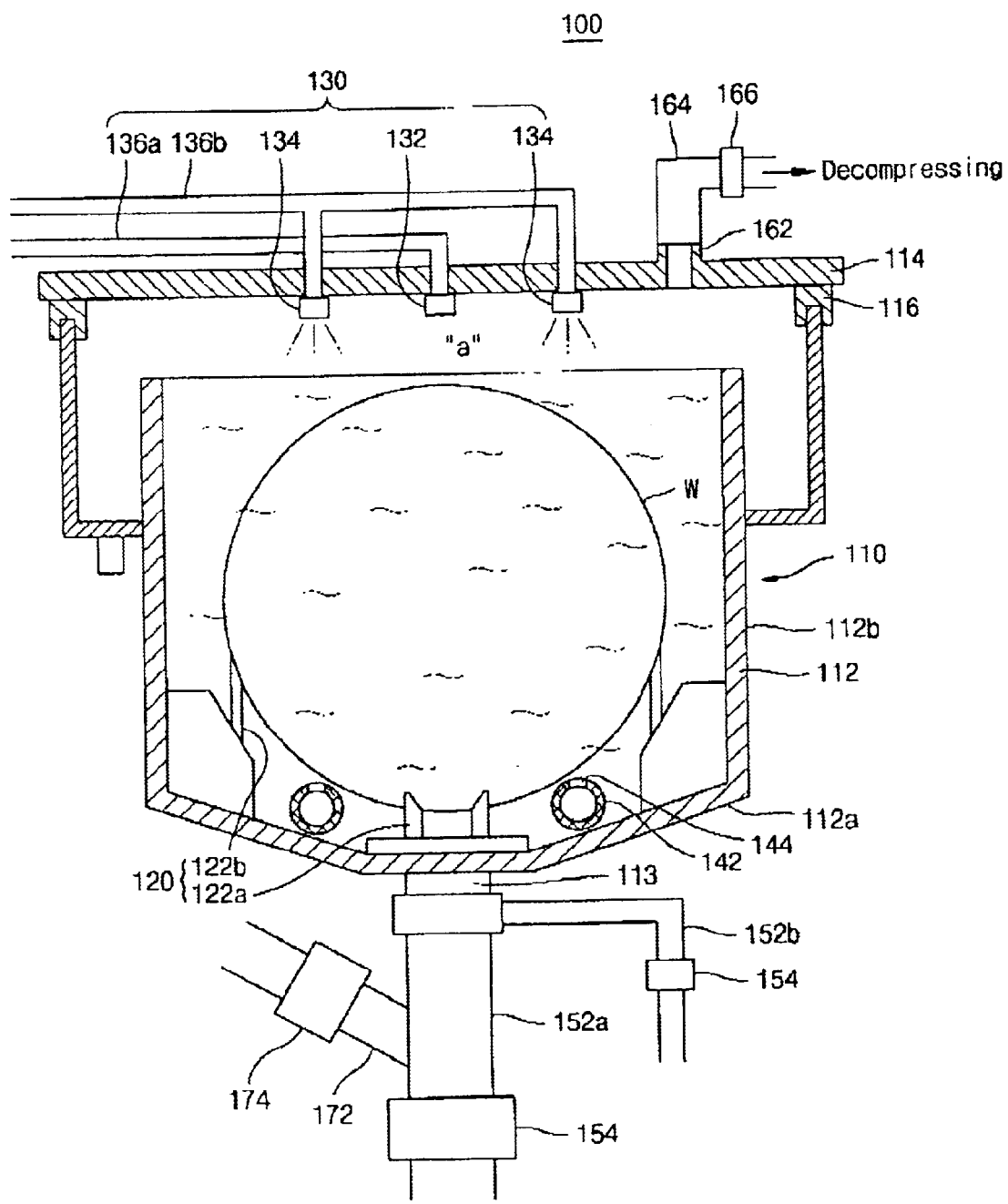
Figure 6:
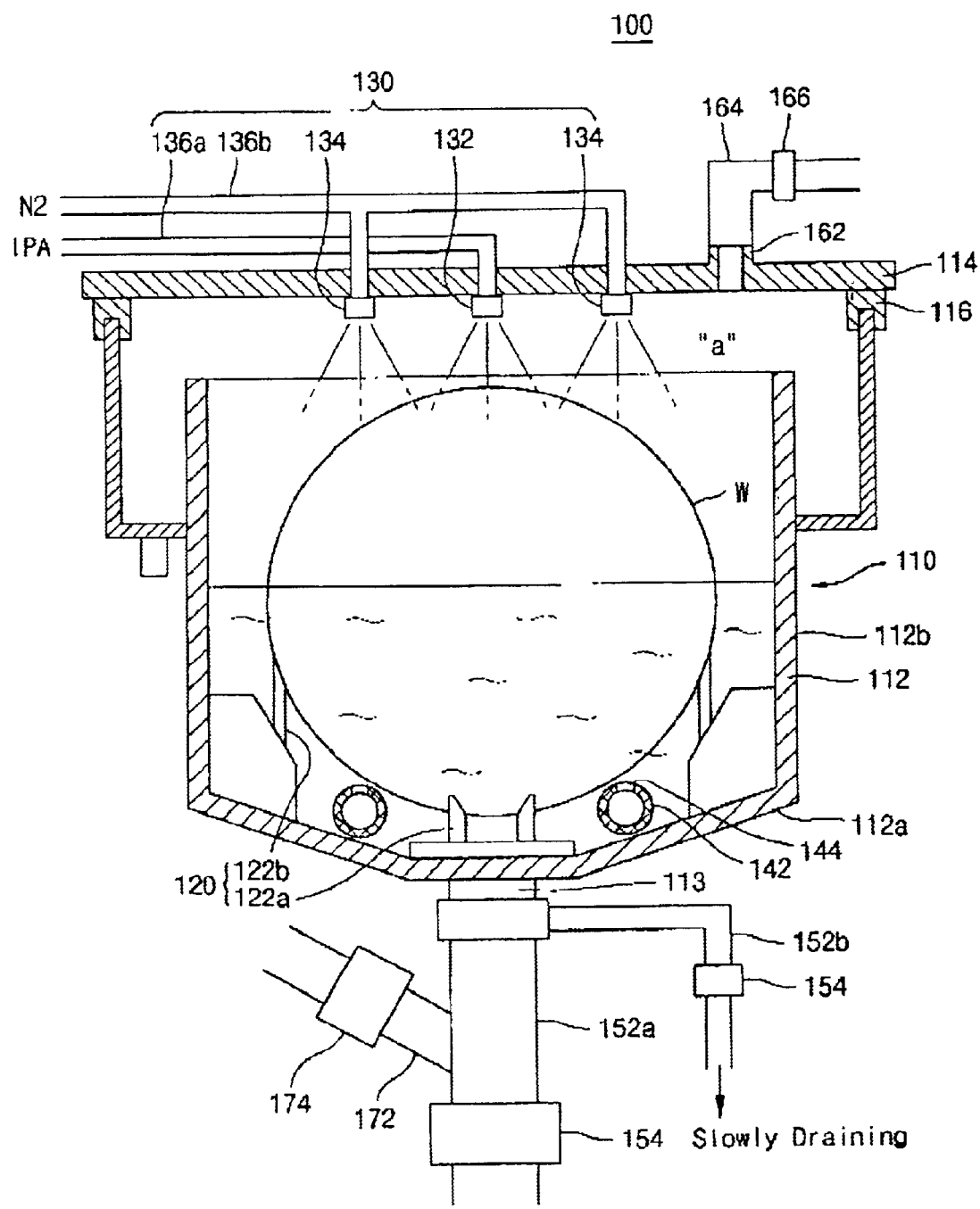

Referring now to FIG. 2, there is illustrated a flowchart of a wafer drying method according to a preferred embodiment of the present invention. In step S110, wafers W are loaded on a wafer guide of a processing bath. In step S120, surface contaminants such as particles are cleared from a wafer surface. In step S130, an inside of a chamber is decompressed. In step S140, de-ionized water (DIW) is drained from the processing bath and IPA vapor and nitrogen are injected onto a surface of the DIW. In step S150, after the DIW is completely drained therefrom, preheated N2 is injected and an inside of the chamber is decompressed. In step S160, a wafer is unloaded. To clear the surface contaminants (step S120), the wafers W are cleaned or rinsed. In a case where the clearing process is for cleaning the wafers W, the liquid may be a chemical solution that is suitable for clearing particles remaining on the wafers W or contaminants such as a native oxide layer. In a case where the clearing process is for rinsing the wafers W, the liquid may be an de-ionized water (DIW) that is suitable for clearing a chemical solution remaining on the wafers W.

The steps are described in further detail hereinbelow with reference to FIG. 3 through FIG. 7.

Figure 7:
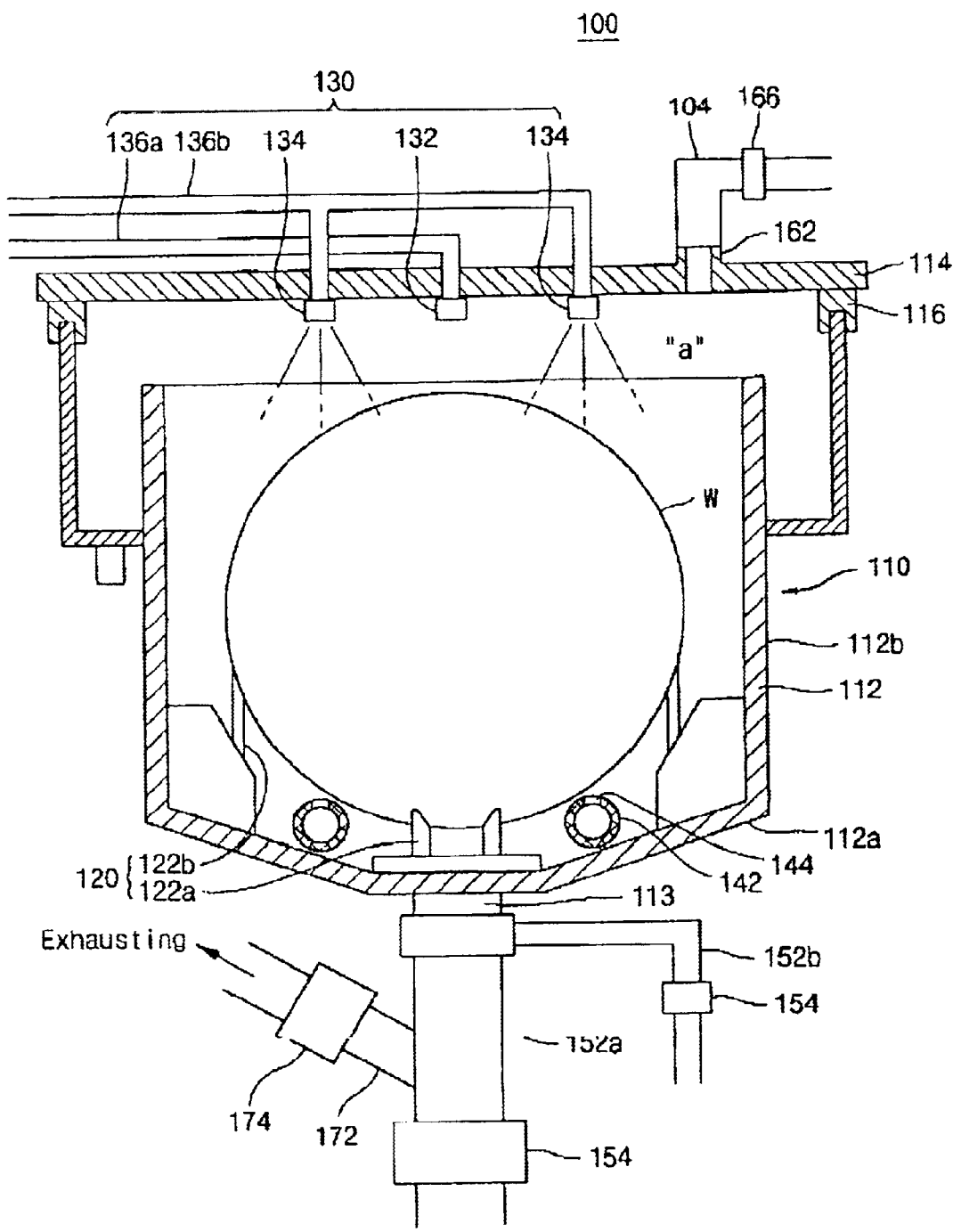

The wafers W are loaded in the processing bath 112. De-ionized water (DIW) is supplied into the processing bath 112 through the distribution pipe 142. The DIW is continuously supplied and drained through the supply means and the drain means in order to rinse the wafers W (see FIG. 3). After rinsing the wafers W, the chamber 110 is decompressed to exhaust air therein (see FIG. 4). That is, the decompression means is used to exhaust air staying in a space "a" between the cover 114 and the processing bath 112 containing the DIW. Nitrogen is supplied into the air-exhausted space "a" (see FIG. 5). In any case, the decompression and compression of the nitrogen are carried out at the same time. After filling the nitrogen with the space "a", the IPA and nitrogen are supplied to an upper part of the DIW in the processing bath 112. Concurrently, the DIW is slowly drained through the second drain pipe 152b (see FIG. 5). Thus, a drying process for eliminating DIW remaining on surfaces of the wafers W is carried out. More specifically, a part of the IPA penetrates into a surface of the DIW to lower a surface tension thereof. Particularly, when the wafers W rise or the DIW level drops during the drying process, a meniscus-shaped liquid surface is formed at a contact part of the surfaces of the wafers W and the DIW. Under these conditions, when the IPA is permeated into the DIW surface, the surface tension at the contact part is lower than that of any other part. The liquid remaining on the surfaces of the wafers W, i.e., the DIW flows toward a portion of high surface tension. As a result, the DIW is maximally eliminated from the surfaces of the wafers W according to the Marangoni effect. Undoubtedly, methane alcohol or ethane alcohol can be used instated of the IPA. When the DIW level falls under the wafers W, the second drain pipe 152b is closed and the first drain pipe 152a is opened to swiftly drain the DIW remaining in the processing bath 112. The first drain pipe 152a drains a solution by means of the gravity. When the DIW is completely drained from the processing bath 112, the final wafer drying process is followed as the next process. Referring to FIG. 7, the final wafer drying process uses heated nitrogen to eliminate particle-shaped DIW remaining on the wafer surface. More specifically, the heated nitrogen is supplied into the processing bath 112 through the N2 nozzle 134. The gases N2 and IPA for drying a wafer and residues including a fume are forcibly exhausted to the first exhaust pipe 172 through the drain port 113 of the processing bath 112. An up-to-down flow is then made in the processing bath 112, so that the residues, N2, and IPA are exhausted quickly and surely to the first drain pipe 172 through the drain pipe 113. Therefore, it is possible to prevent a turbulence from occurring in the processing bath 112. That is, a gas flow in the processing bath 112 can be stably maintained. If an unstable gas flow such as vortex occurs in the processing bath 112, it is hard to obtain a wafer particle drying effect that is achieved at a wafer surface by injecting N2 of high temperature. Accordingly, what is very significant is to stabilize and quickly exhaust a gas flow in the processing bath 112 during the wafer drying process. As a result, the N2 and residues are swiftly exhausted through the first exhaust pipe 172 during the wafer drying process. In addition, new N2 is supplied onto the wafer surface to minimize the wafer contamination caused by the residues and to maximize the water particle eliminating effect at the wafer surface.

Although the foregoing description of the preferred embodiments of the present invention has shown, described and pointed out the fundamental novel features of the invention, it will be understood that various omissions, substitutions and changes in the form of the detail of the apparatus as illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A method for drying a semiconductor substrate, comprising the steps of:
    clearing the substrate by supplying a liquid into a processing bath of a chamber;
    decompressing an inside of the chamber;
    draining the liquid from the processing bath and injecting a first dry gas onto a surface of the liquid in the processing bath; and
    injecting a second dry gas onto the substrate after the liquid is completely drained therefrom.

2. The method as recited in claim 1, wherein the second dry gas is nitrogen or carbon dioxide or dry air.

3. The method as recited in claim 1, wherein a temperature of the second dry gas is between an ordinary temperature and 120° C.

4. The method as recited in claim 1, wherein the inside of the chamber is decompressed by exhausting air from the chamber through a vacuum exhaust pipe installed at the cover.

5. The method as recited in claim 1, wherein the second dry gas is vacuum-drained in the step of injecting the second dry gas.

6. A method of drying a semiconductor substrate, comprising the steps of:
    clearing the substrate by supplying a liquid into a processing bath of a chamber;
    injecting first dry gases onto a surface of the liquid supplied into the processing bath;
    draining the liquid from the processing bath so that the substrate is slowly exposed to the surface of the liquid; and
    injecting a second dry gas into the chamber and forcibly exhausting the gas in the chamber.

7. The method as recited in claim 6, further comprising a step of decompressing the inside of the chamber before injecting the first dry gas to exhaust air in the chamber.

8. The method as recited in claim 7, wherein the air in the chamber is exhausted through an exhaust port installed at the cover.

9. The method as recited in claim 7, wherein the step of exhausting the air in the chamber includes a step of supplying an inert gas into the chamber.

10. The method as recited in claim 6, wherein when the liquid is completely drained from the processing bath, the second dry gas is vertically injected from an upper part of the processing bath, and the second dry gas injected into the processing bath and vapor evaporated from a wafer surface by the second dry gas are forcibly exhausted to an exterior of the processing bath.

11. The method recited in claim 10, wherein the gas in the processing bath is exhausted through an exhaust pipe connected to a drain pipe where the liquid is drained.

12. The method recited in claim 6, wherein the second dry gas is injected after completely draining the liquid in the processing path.

13. The method as recited in claim 6, wherein the second dry gas is an inert gas preheated at a temperature between an ordinary temperature and 120° C.

14. The method as recited in claim 6, wherein the liquid is de-ionized water (DIW).

15. The method as recited in claim 6, wherein the first dry gases are preheated alcohol vapor and nitrogen.

16. The method as recited in claim 15, wherein the alcohol is one selected from the group consisting of methane alcohol, ethane alcohol, and isopropyle alcohol (IPA).

* * * * *